United States Patent
Lo et al.

(10) Patent No.: US 7,262,418 B2
(45) Date of Patent: Aug. 28, 2007

(54) METHOD AND APPARATUS FOR MULTIPLE CHARGED PARTICLE BEAMS

(75) Inventors: Chiwoei Wayne Lo, Campbell, CA (US); Xinrong Jiang, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 167 days.

(21) Appl. No.: 10/825,696

(22) Filed: Apr. 15, 2004

(65) Prior Publication Data

US 2006/0108531 A1    May 25, 2006

Related U.S. Application Data

(62) Division of application No. 09/898,318, filed on Jul. 2, 2001, now Pat. No. 6,750,455.

(51) Int. Cl.
*G21K 1/08* (2006.01)
*G01J 5/02* (2006.01)

(52) U.S. Cl. ............ 250/396 R; 250/310; 250/396 MI

(58) Field of Classification Search .. 356/237.1–237.6, 356/300–334; 250/310–311, 307, 396 R, 250/396 MI, 396 ML, 492.1
See application file for complete search history.

(56) References Cited

U.S. PATENT DOCUMENTS

| | | | |
|---|---|---|---|
| 3,715,580 A * | 2/1973 | Maekawa et al. ........... 250/397 |
| 5,557,105 A * | 9/1996 | Honjo et al. ................ 250/310 |
| 5,729,022 A * | 3/1998 | Veneklasen et al. . 250/396 ML |
| 6,369,385 B1 | 4/2002 | Muray et al. |
| 6,376,984 B1 * | 4/2002 | Fernandez et al. .......... 313/530 |
| 6,465,783 B1 | 10/2002 | Nakasuji |
| 6,512,227 B2 * | 1/2003 | Iwabuchi et al. ........... 250/310 |
| 6,593,584 B2 * | 7/2003 | Krans et al. ............. 250/492.2 |
| 6,646,275 B2 * | 11/2003 | Oae et al. ................ 250/492.2 |
| 7,067,809 B2 * | 6/2006 | Lo et al. .................... 250/310 |
| 2001/0028038 A1 * | 10/2001 | Hamaguchi et al. . 250/396 ML |

OTHER PUBLICATIONS

T.R. Groves, et al., "Distsributed, multiple variable shaped electron beam column for high throughput maskless lithography", J. Vac. Sci. Technol., B 16(6), Nov./Dec. 2000, pp. 3168-3173.

E. Yin, et al., "Electron optical column for a multicolumn, multibeam direct-write electron beam lithography system", J. Vac. Sci. Technol., B 18(6), Nov./Dec. 2000, pp. 3126-3131.

(Continued)

*Primary Examiner*—Sang H. Nguyen
(74) *Attorney, Agent, or Firm*—Tarek N. Fahmi

(57) ABSTRACT

A multi-charged particle beam tool for semiconductor wafer inspection or lithography includes an array of electron beam columns, each having its own electron or ion source. The objective lenses of the various electron beam columns, while each has its own pole piece, share a common single magnetic coil which generates a uniform magnetic field surrounding the entire array of electron beam columns. This advantageously improves the spacing between the beams while providing the superior optical properties of a strong magnetic objective lens. When used as an inspection tool, each column also has its own associated detector to detect secondary and back-scattered electrons from the wafer under inspection. In one version the gun lenses similarly have individual pole pieces for each column and share a common magnetic coil.

5 Claims, 13 Drawing Sheets

OTHER PUBLICATIONS

A. Khurshee, "Permanent magnet objective lenses for multicolumn electron-beam systems", Review of Scientific Instruments, vol. 72, No. 4, Apr. 2001, pp. 2106-2109.

Eiichi Goto et al., "MOL (moving objective lens) Formulation of deflective aberration free system", Optik, 48 (1977), No. 3, pp. 255-270.

* cited by examiner

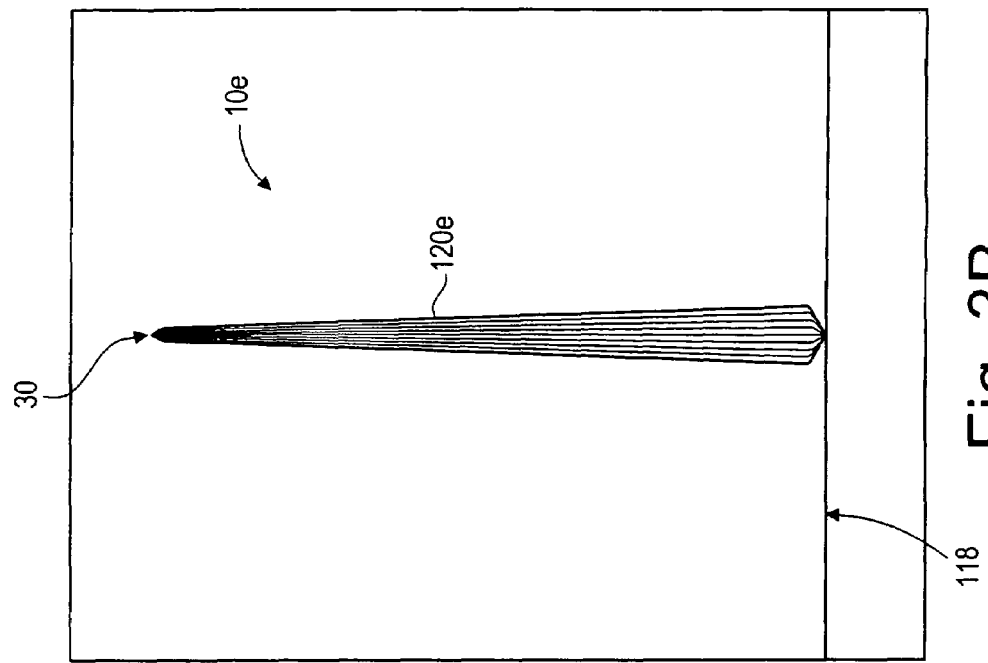
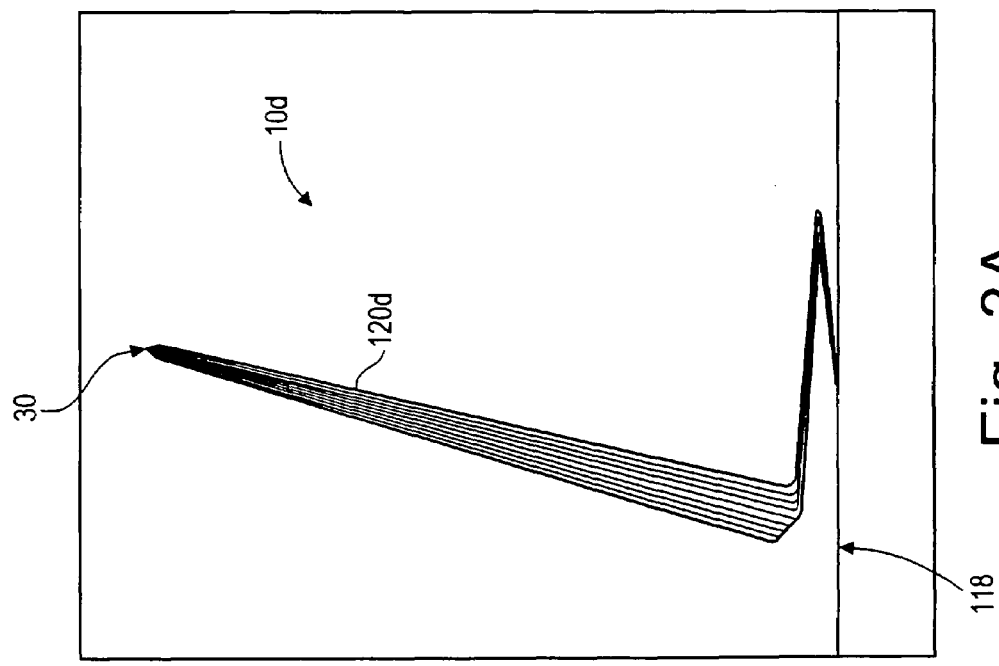

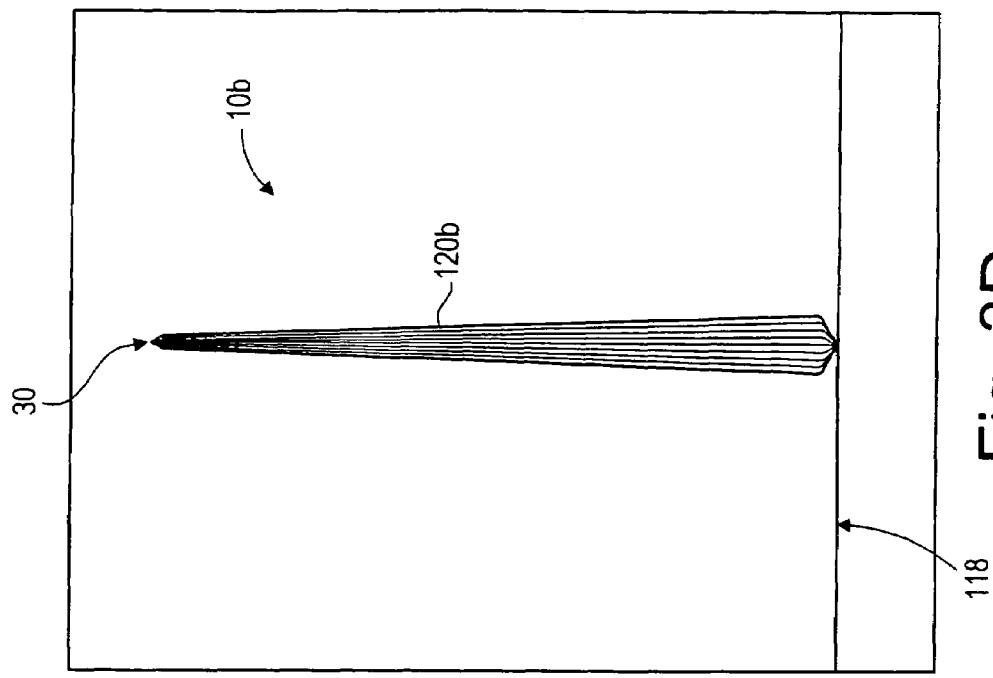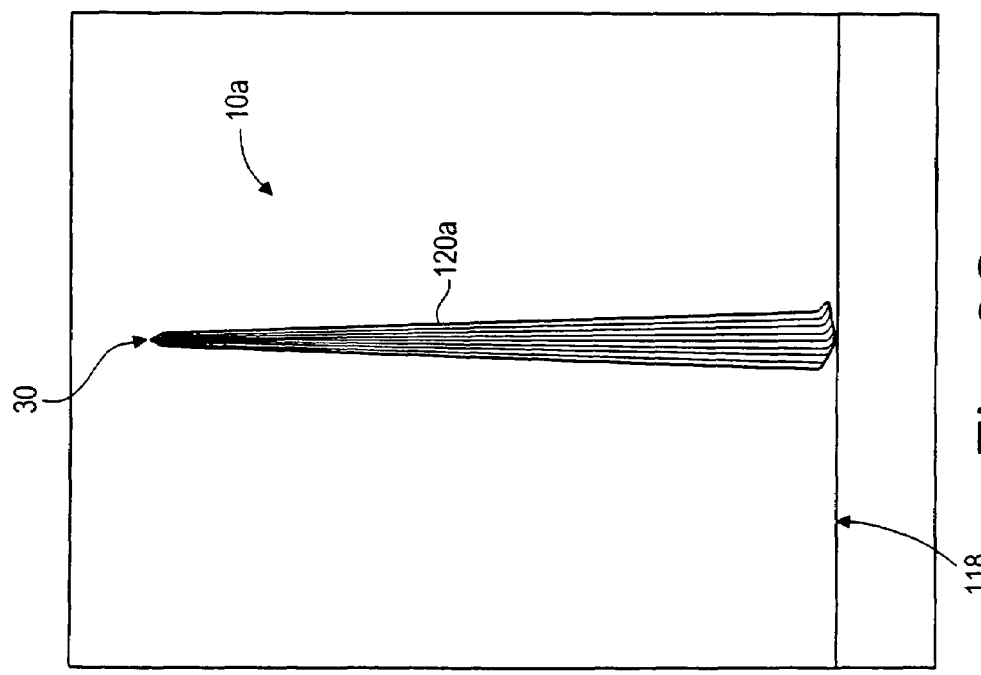

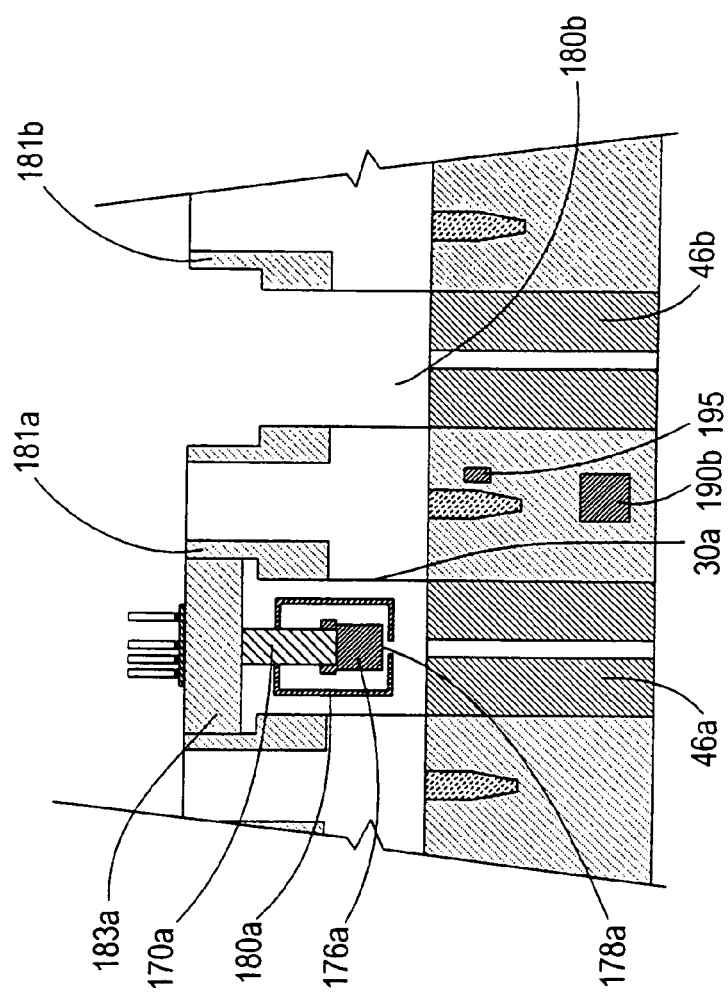
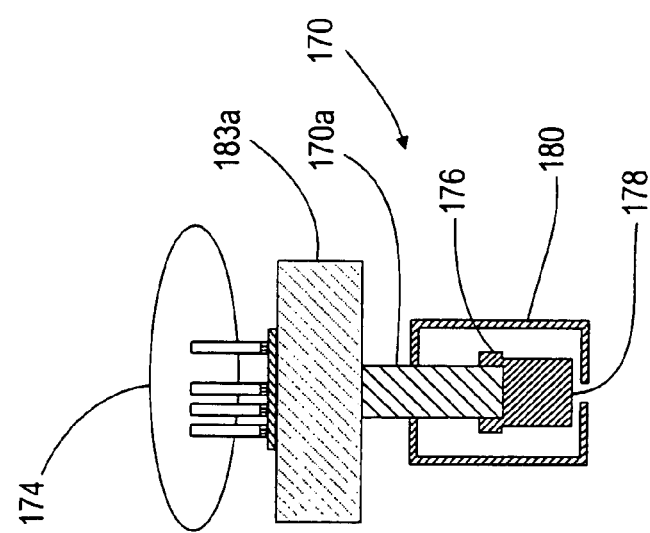
Fig. 5C
Fig. 5B

METHOD AND APPARATUS FOR MULTIPLE CHARGED PARTICLE BEAMS

RELATED APPLICATIONS

The present application is a divisional of co-pending U.S. patent application Ser. No. 09/898,318, entitled "Method and Apparatus For Multiple Charged Particle Beams", filed on Jul. 2, 2001 now U.S. Pat. No. 6,750,455. This patent application is hereby incorporated by reference in its entirety.

FIELD OF THE INVENTION

This invention relates to multiple charged particle beams, for use in inspection or lithography.

BACKGROUND

It is well known to inspect semiconductor devices, for instance, those fabricated on semiconductor wafers, using a scanning electron beam inspection tool. Advantageously such electron beam inspection is not constrained by the optical (light) diffraction limits encountered by optical inspection techniques. Therefore electron beam inspection is considered useful for next generation (critical dimension less than 0.25 microns) inspection for semiconductor manufacturing. Currently commercially available electron beam-based inspection machines use a single electron beam column, based on the principle of scanning electron microscopy. The single electron beam is raster scanned over the areas of interest on a fabricated semiconductor wafer. Secondary and back-scattered electrons generated by the incident beam are detected and registered pixel-by-pixel using conventional image processing techniques to reconstruct an image of the inspected region.

Low throughput is a significant obstacle in such machines, because the images are acquired as described above pixel-by-pixel in a sequential manner. Low throughput significantly raises inspection costs and hence is undesirable.

SUMMARY

In accordance with this invention, an apparatus and associated method are provided for electron (or other charged particle) multiple beams for inspection or lithography of microstructures such as features formed on a semiconductor wafer. Applications include high-speed imaging, charged particle lithography and defect inspection of micro-fabricated structures including defect inspection of integrated circuit die on semiconductor wafers, masks or reticles for microfabrication, flat panel displays, and micro-electromechanical (MEMs) devices during and after manufacture. In particular, one embodiment is directed to high-speed defect inspection with a cost-effective and scalable multi-beam approach. The inspected features include, for instance, gates, contacts, vias, interconnects, and other semiconductor or micro-machined structures, including diffused regions.

The apparatus (tool) includes array of charged particle beam columns, each directing its beam onto the workpiece (e.g., semiconductor wafer). Each beam column includes its own electron source (emitter) or ion source; a gun lens downstream of the source to focus the charged particles into the beam; a suitable beam aperture and an associated isolation valve to preserve the vacuum; column alignment and astigmatism correction compensation elements; a secondary (back-scattered) electron or particle detector and an objective lens. (It is to be understood that generally here the terms optics, lens, etc., apply to charged particle optics, rather than to light optics.)

The array of beam columns, a 3.times.3 or 5.times.5 beam array for instance, also includes a single objective lens coil, which is an electro-magnetic coil surrounding the individual objective lens pole pieces of all the beam columns in the array. This arrangement provides superior (lower cost and greater stability) optical properties and high electron beam density.

One limitation of the throughput of a prior art single column system for inspection is the individual detector/data path performance, which typically, in terms of data flow, is less than 100 Mhz per second. The present multibeam (multicolumn) system, in contrast, does not have this limitation because the required bandwidth for each detector is reduced by the number of columns. The distribution of the column array across a region under inspection (or being imaged for lithography) of the workpiece makes it possible to implement a stage with travel a fraction of the size of the workpiece. This reduces the footprint of the associated vacuum chamber to ½ to ⅓ of the size required in the prior art, e.g., a typical chamber holding a 300 mm wafer stage is 1.5 to 2 meters long but a typical 200 mm wafer stage chamber is about 50% smaller. The smaller 200 mm stage can be used with the column array to inspect or fabricate a 300 mm wafer.

Also included, in one embodiment, are "null" (dummy) beam columns surrounding the column array. That is, the perimeter portions of the array contain beam columns that may omit certain elements (for instance, electron emitter and detectors) but do contain other elements (for instance, the magnetic objective lens pole pieces, the magnetic gun lens pole pieces, and magnetic deflection elements) as do the active columns. The null columns are included to improve the optical properties of the active columns.

An associated method uses multiple beam columns each with its own detector for micro-structure inspection. This can be done using a step-and-scan scheme for inspection or continuously moving the stage supporting the workpiece under inspection. If one of the beam columns fails, the system control system registers this failure. The area intended to be inspected by the failed beam column can be inspected using one of the other (active) columns or be inspected using a conventional single column system that is designed to inspect a small portion of a wafer.

BRIEF DESCRIPTION OF THE DRAWINGS

FIGS. 3A, 3B, 3C, 3D depict individual beam paths.

FIGS. 5A, 5B, 5C depict detail of the electron gun of FIG. 1.

DETAILED DESCRIPTION

In accordance with this invention, inspection or lithography tools and associated methods use an array of charged particle (e.g., electron) beam columns. In semiconductor lithography (patterning) there are well known multi-electron beam column technologies. However, these are specifically intended for electron beam lithography which does not require superior imaging capability of backscattered or secondary particles. Examples of these lithography techniques include the micro-column approach proposed by Etec Systems, Inc.; micro-column thin film transistor flat panel display lithography techniques; multiple electron beam columns proposed by Etec Systems, Inc.; and the multi-beamlet approach developed by International Business Machines. These all have significant shortcomings either in terms of the electron source, the detectors, the voltage contrast, the space occupied, potential wafer damage or complexity. They especially have such shortcomings in the inspection context.

Low energy electron microscopy technology based on electron beam projection imaging requires the workpiece be immersed in a strong electrostatic field. This is not suitable for inspection of semiconductor wafers, where the wafers cannot be exposed to the associated harmful high voltages. Other potential problems with this approach are the requisite small physical sample size and the small field of view.

In contrast, the present tools and associated methods use an array of electron beam columns, each having a single beam, each beam having a current in the range of, for instance, 10 to 100 nanoamps with resolution in the range of a few nanometers to 0.1 micron. This tool is capable of inspecting at a rate of tens of gigapixels per second as compared to only 10 to 100 megapixels per second using current commercially available electron beam single column inspection systems. Hence the present tool provides 10 to 100 times greater throughput than do current single beam column inspection tools, for instance, the Odyssey 300 inspection tool supplied by Schlumberger Technologies of San Jose, Calif. A tool as disclosed herein with suitable modifications is also suitable for lithography.

A typical energy of each electron beam in the present tool is approximately a few tens of eV. A typical diameter of each beam is 0.1.mu.m. In one embodiment, the number and arrangement of electron beam columns in the array is, for instance, 2.times.2, 3.times.3, 4.times.4 or 5.times.5; other arrangements are possible and the array need not be square (n.times.n). A typical spacing of the electron beams is a few to tens of mm center-to-center. In order to inspect a particular semiconductor wafer region, the workpiece (e.g., wafer) under inspection is translated in a plane normal to the beams either in a continuous movement or in step-and-scan movement using a conventional stage.

Figure 1:
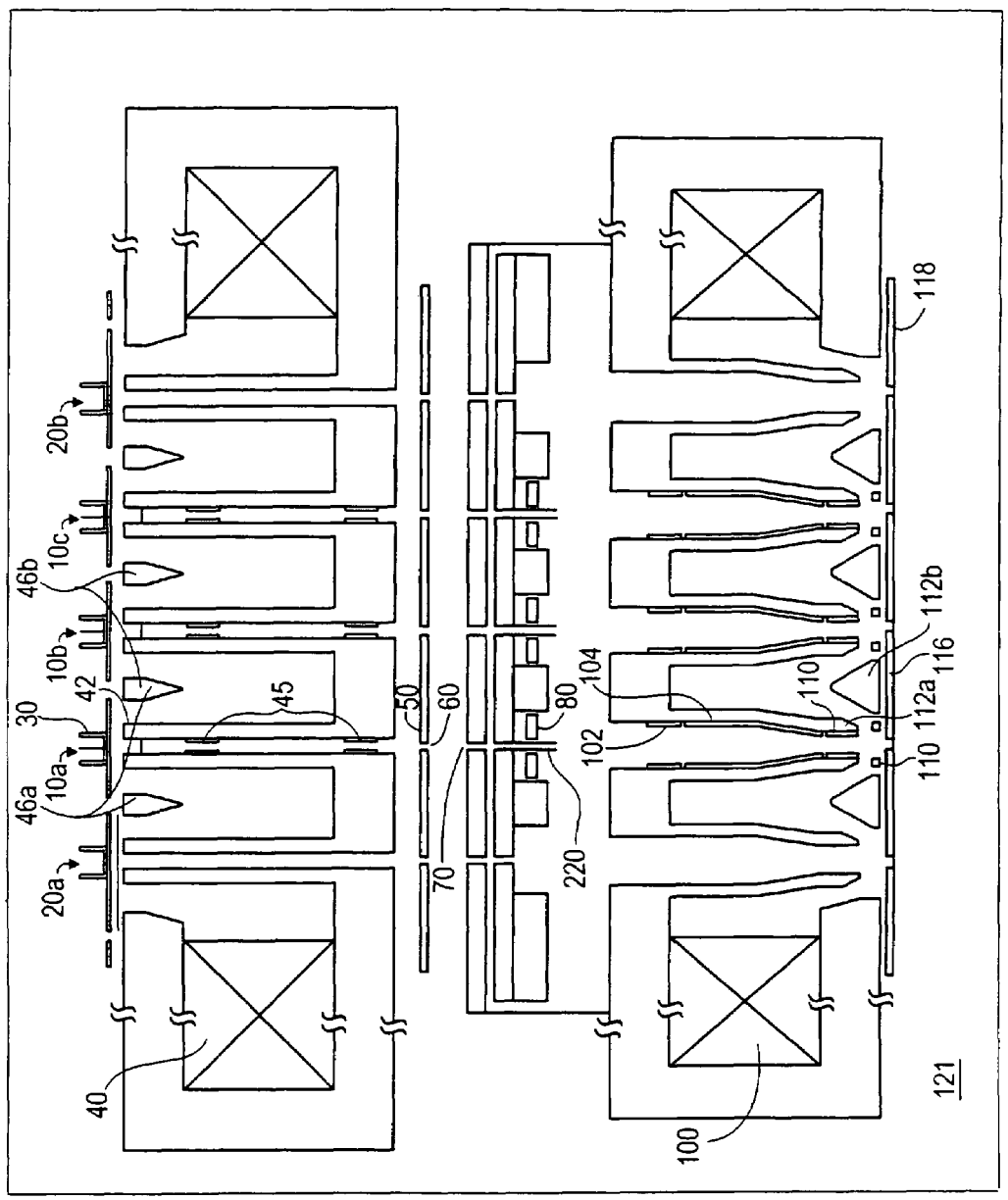
FIG. 1 depicts a multiple charged particle beam apparatus.

One embodiment of the present tool is depicted in FIG. 1 in a side cross-sectional view. It is to be understood that in this and the other figures some of the conventional structures of the type generally present in electron or ion beam equipment are not shown, including the vacuum containment chamber, vacuum tubing and pumps, stage interferometer, stage controller, electrical interconnections, various mounting and spacing structures, control electronics, host computer, card cage, control computer, image processing computers, data base computers, and the computer network.

In one embodiment, the FIG. 1 tool is assembled from conventional electron beam column components, that is, the column electromagnetic optical components are fabricated by a conventional precision machine shop. Alternatively, a micro-machined version is possible. Dimensions and/or numerical values provided herein are illustrative and not limiting. The exact size, of course, is generally not critical for the components; the size of the components, the electrical currents and power, the electron beam current, brightness and energy are determined by the particular inspection or lithography application, as is understood by those knowledgeable in the charged particle beam field.

In FIG. 1, relevant portions of the tool as depicted in a simplified side cross sectional view include a 5.times.5 array of electron beam columns. Since this is a side view, only five of the columns (those in the same row) are shown. Only three columns 10a, 10b, and 10c (the active columns) produce electron beams while columns 20a and 20b are "dummy" columns (null columns) for improving the electron optical properties of the three active columns. The differences between active columns and null columns are explained below. The number of active columns may be expanded to, e.g., 4.times.4, 5.times.5, and the number of null columns may be more than one row on each side of the array to surround the active columns.

FIG. 1 depicts detail for each active column, e.g., column 10a. Each column 10a includes an electron emitter 30, which is part of an electron gun (which also includes a single common gun lens coil 40), gun octapole 45, beam current limiting aperture 50, isolation valve 60, alignment coils and astigmatism correction coils assembly 70, secondary particle detector 80, and an objective lens 100. The detector 80 if present when the tool is used for lithography is then located near the wafer 118.

The gun lens includes in this embodiment a single magnetic coil 40 which surrounds all of the columns in the array, including columns 10a, 10b, 10c, 20a and 20b. The gun lens coil 40 has associated concentric pole pieces, e.g., 46a, 46b in each column. Similarly the objective lens is a second magnetic coil 100 surrounding the lower portions of all the columns. These single coil lenses have been found to result in better optics and resolution. In this embodiment both the gun lens and objective lens are magnetic type rather than electrostatic. Although magnetic lenses in general have a better resolution, it is possible alternatively to use electrostatic lenses. The objective lens pole pieces may be a micro-fabricated structure.

As shown, in the lower portion of each column, for instance, column 10a in FIG. 1, there are a number of other essentially conventional structures. These include the prescan coil 102 followed by the solenoid 104 which collimates the secondary (backscatter) electrons. Immediately downstream of the solenoid 104 is the scan coil 110 followed by the pole pieces 112a, 112b. Below that is located the charge control plate 116. The wafer (or other workpiece) is shown in this side view as dark line 118 and is supported on a conventional stage 121 immediately below wafer 118. One suitable stage is disclosed in copending application Ser. No. 09/318,400, filed May 25, 1999, entitled "Stage for Charged Particle Microscopy System", incorporated herein by reference in its entirety.

All of the column structures in FIG. 1 are shown in cross section and are rotationally symmetric about the electron beam axis for each column. The two lens coils 40 and 100 are also cylindrical structures surrounding all of the columns. Each active column 10a, 10b and 10c, is identical. The outer null columns 20a, 20b have most of the structures of the active columns but omit, for instance, the electron emitter and the detector as not being needed.

The conventional electron emitter 30 is, for instance, a thermal field emitter (TFE) or Schottky emitter of the type commercially available, for instance, from FEI or Danka Co.

Other suitable emitters are lanthanum hexabromide (LaB.sub.6) thermal field emitters or cold field emitters. It is preferred to use an emitter having high brightness and high stability, e.g., of the TFE or Schottky type. A TFE/Schottky type emitter typically requires a negative 300 V suppressor voltage to suppress electron emission from the emitter shank. The emitter cup is the illustrated structure surrounding the emitter. The suppressor cups each electrically float, relative to the beam voltage, at a second common voltage and are driven by a single power supply (not shown). Each emitter has a conventional associated extraction field high voltage supply control and also filament heating control. A common power supply is used to drive all the electron emitters in the array of columns.

Each emitter 30 is typically resistively heated to 1700-1900 degree Kelvin and electrically floats at a negative beam potential. Each emitter has its own current source supply for the filament heating. An independent extraction electrode is located downstream of each emitter, typically 0.3-0.6 mm away from the emitter surface. The extraction electrode floats at a positive potential (voltage) relative to the emitter potential in order to extract electrons from the emitter. Because each emitter has a slight variation in tip radius and extractor distance, the extraction potential may vary between each emitter. Therefore, each extraction electrode is driven by an individual power supply. The extraction voltage is adjusted such that each electron gun emits electrons at essentially the same brightness.

The conventional ultra high vacuum environment for TFE emitters and accurate alignment between the emitter and the associated gun lens center are also provided. As is well known, a TFE-type emitter typically requires a surrounding vacuum better than about 1.times.10.sup.−8 torr to achieve bright, long lifetime stable emission. This emitter vacuum is maintained by a conventional vacuum enclosure surrounding the columns and stage and associated ion pumps (not shown). Because the columns share a common vacuum enclosure, vent holes (as described below) are provided to connect the columns so that they can be commonly pumped by one or more ion pumps.

In the depicted embodiment the gun lens is a single common coil 40 with individual column pole pieces 46a, 46b. A strong magnetic lens using a pole piece is known for its superior electron optical properties, compared to an electrostatic lens when used to focus relatively low energy electron beams, as in this tool. However, most prior art multi-beam systems (as used in lithography) adopt electrostatic lenses because a strong magnetic lens occupies a larger footprint and thereby imposes a restriction on the number of beams. A single coil 100 array magnetic objective lens with individual column pole pieces 116 resolves this footprint problem because here only a single circumferential coil 100 is used for the entire array of columns. The single coil 100, shown in cross-section in FIG. 1, is located at the periphery surrounding the array of electron beam columns. This allows more electron beam columns to be packed into a smaller footprint.

In another embodiment, the gun lenses are of electrostatic type, such as the common tetrad lens used in the commercially available Schlumberger Technologies IDS series 10000 electron prober or that of the type used in commercially available FEI scanning electron microscopes. Each lens in this embodiment includes an extractor electrode, a lens electrode, and an anode electrode. Varying the lens electrode voltage focuses or defocuses the beam.

Figure 2A:
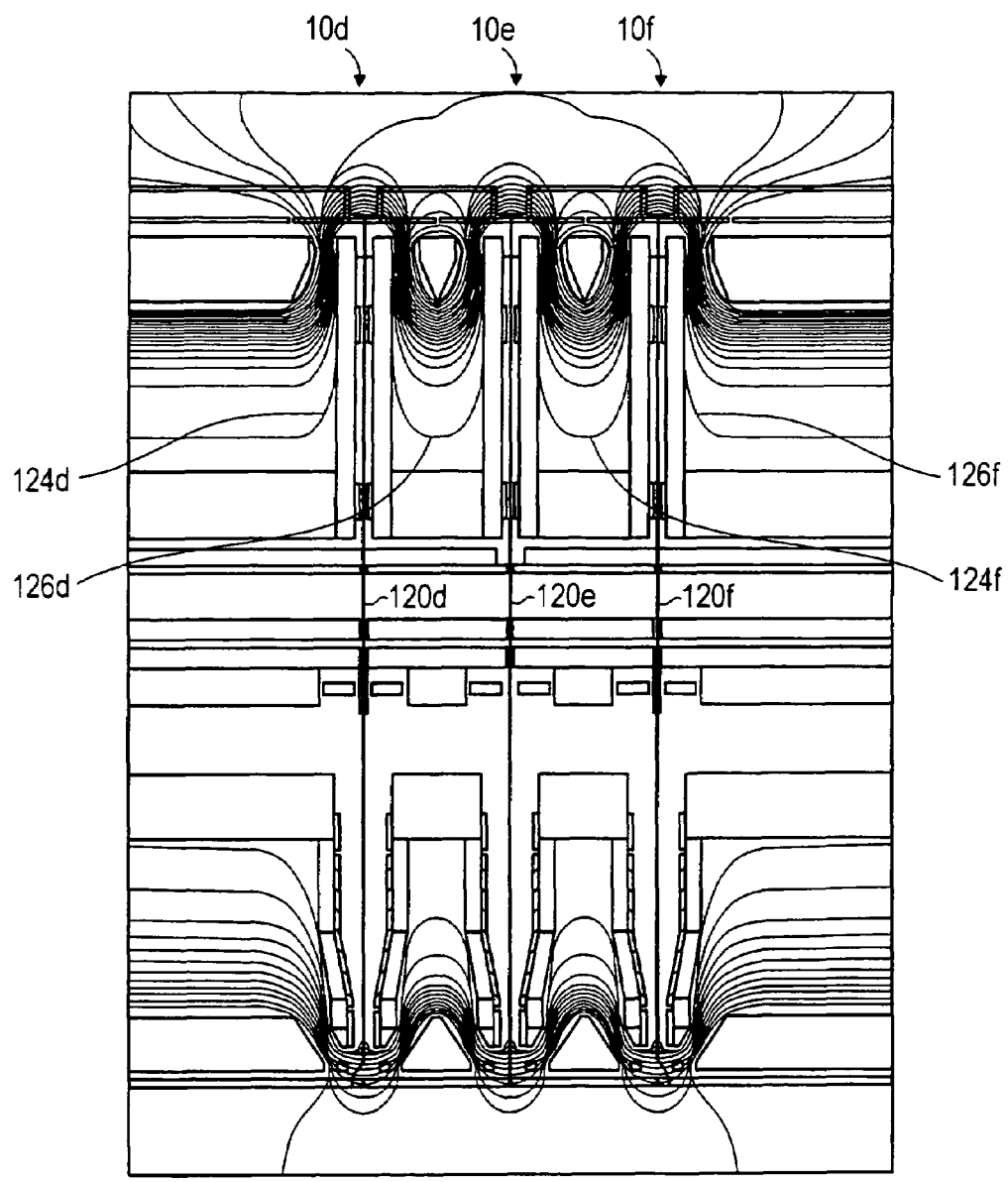
FIGS. 2A, 2B depict electromagnetic fields for multiple beam arrangements.

It has been found that, with the single coil objective or gun lenses as described here, those electron beam columns at the periphery of the array have poorer optics than those in the center due to the asymmetric arrangement. This problem is illustrated in FIG. 2A where a side view of a 3.times.3 column array is shown including active columns 10d, 10e, 10f, which are otherwise identical to columns 10a, 10b, 10c of FIG. 1. The associated electron beams 120d, 120f are those in peripheral columns 10d, 10f while beam 120e is in the center column 10e. The gun equi-potential lines 124d, 126d for focusing beam 120d are not symmetric; neither are the equi-potential lines 124f, 126f which focus beam 120f. In contrast, potential lines 126d, 124f are quite symmetric for focusing the center beam 120e. The asymmetrical equi-potential lines for the peripheral columns 10d, 10f severely degrade the optics quality and they result in an undesired deflection field on the associated beams.

The problem is further seen by comparing the beam 120d electron trajectories in a peripheral column 10d (FIG. 3A) and that in the center column 10e (FIG. 3B). FIG. 3A depicts an exemplary electron beam 120d located in a peripheral column in the array. Beam 120d is emitted from emitter 30 and is incident on the surface of wafer 118. FIG. 3A corresponds to FIG. 2A with the beam column structures being omitted for simplicity. FIG. 3A shows the beam 120d is substantially deviated away from its intended axis, which is a vertical line extending from emitter 30 perpendicular to the surface of wafer 118. FIG. 3B depicts the beam 120e in the center column 10e, also shown in FIG. 2A, showing it suffers no such deviation. The deviation shown in FIG. 3A is undesirable. Note that the horizontal scale in FIGS. 3A, 3B is reduced relative to that of FIG. 2A so that the deflection of the beam in the peripheral column of FIG. 3A is apparent. This problem is solved by including null columns 20a, 20b in the column array as in FIG. 2A.

Figure 2B:
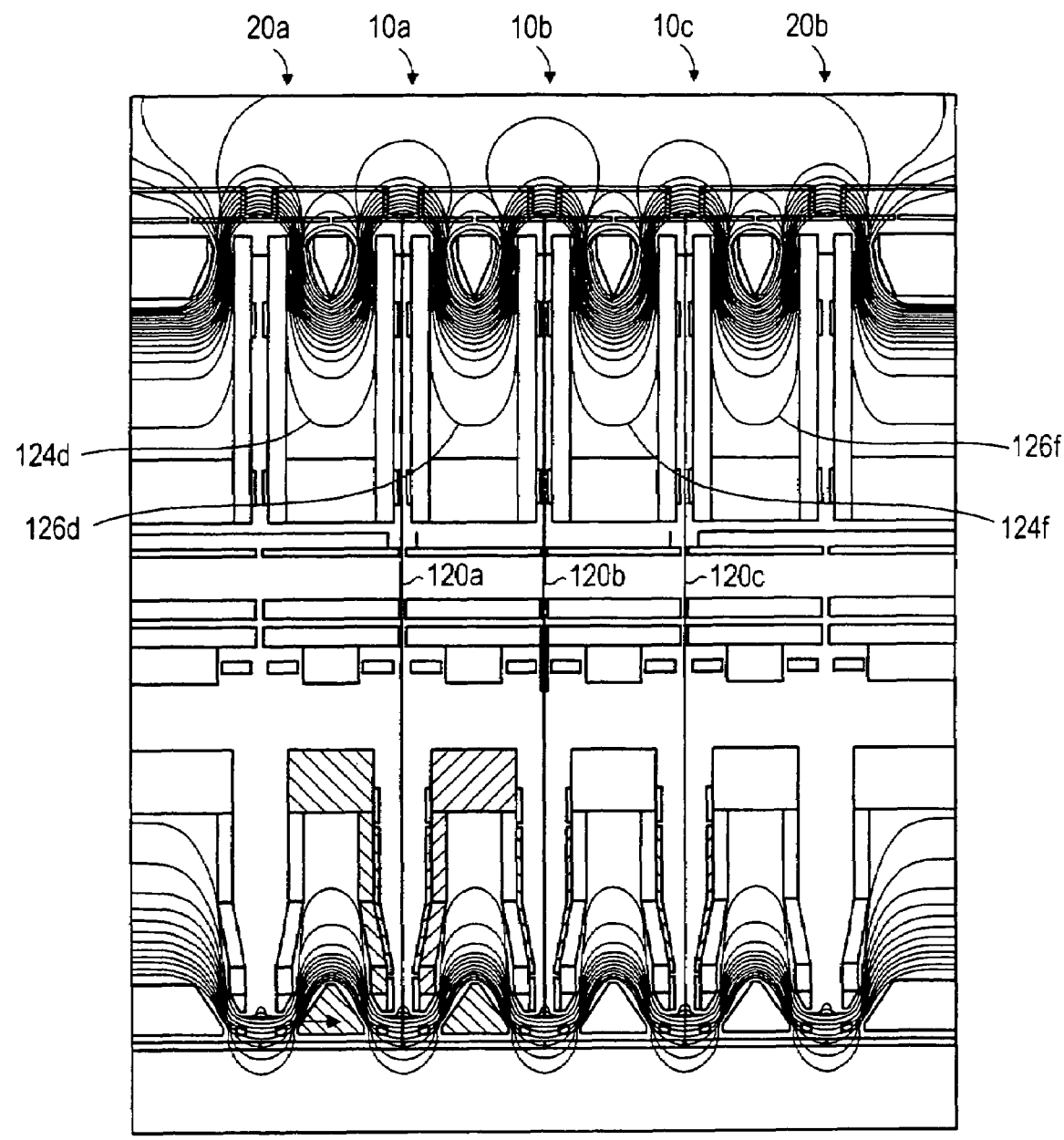

FIG. 2B shows an example of the field lines for a 3.times.3 active column array in a 5.times.5 column array configuration (with 16 null columns) as in FIG. 1. FIG. 3C shows how electron beam 120a suffers only very slight deviation from its nominal position. FIG. 3D shows electron beam 120b of FIG. 2A, again showing no deviation. Thus FIGS. 3A-3D show the advantage of use of the null columns. It is apparent from FIG. 3C that the deflection problem of FIG. 3A does not exist in the peripheral active columns 10a, 10c when the null columns 20a, 20b are provided.

Figure 4:
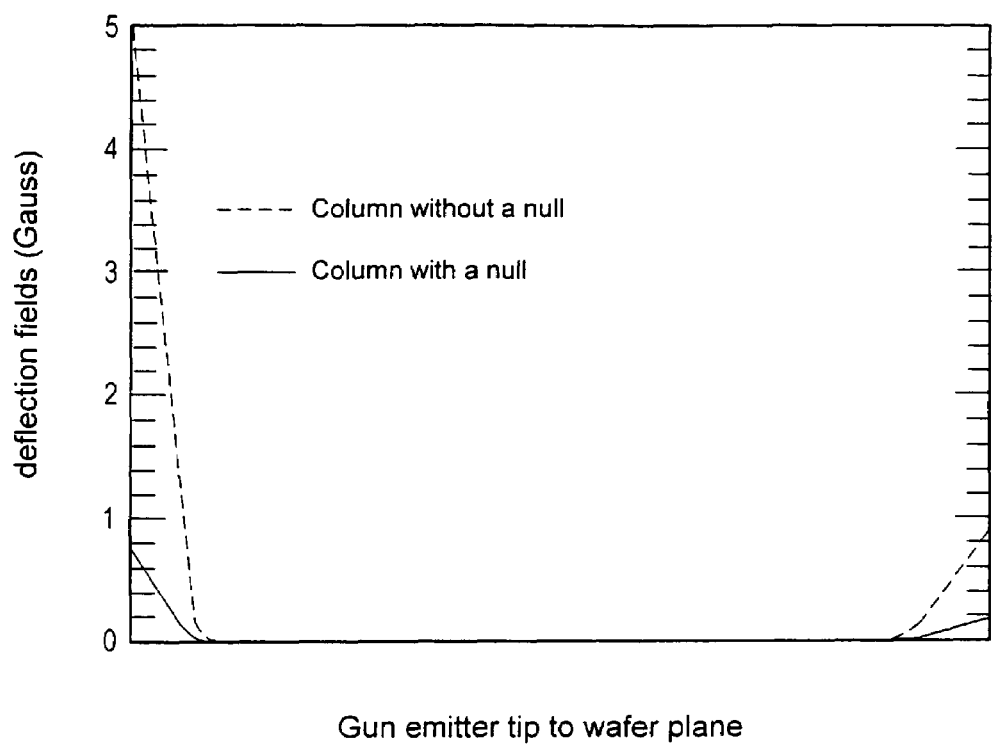
FIG. 4 depicts a plot of an undesired deflection field for peripheral beams in a beam array.

FIG. 4 illustrates the effect of the unintended deflection field which causes the undesired trajectories deviation shown in FIG. 3A. FIG. 4 is a plot with the horizontal axis being the distance from the electron gun emitter tip (left side of figure) 10 to the surface of wafer 118 (right side of figure) for a column. The vertical axis shows the additional deflection fields transversed to the beam axis (expressed in Gauss, the standard unit of magnetic measurement). The broken line is the plot for an active column without the null column being adjacent, that is, for a peripheral column in the array where the peripheral column is an active column, whereas the solid line is for the case of an active column with an adjacent null column, as shown in FIG. 2B. As can be seen there is undesirably significantly greater deflection in the absence of the null column.

Figure 5A:
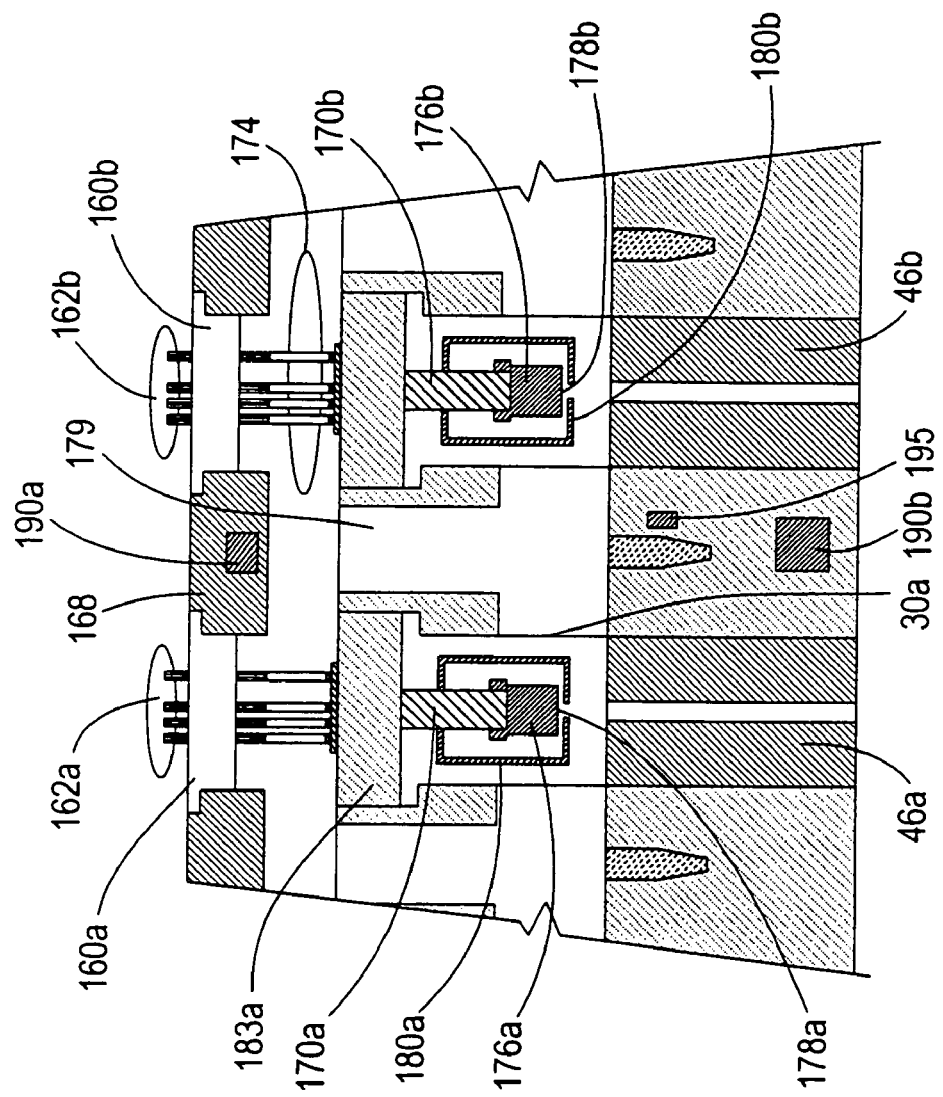

One embodiment of the electron emitter (source) 30 and associated gun lens arrangement is depicted in FIGS. 5A, 5B, 5C. FIGS. 5A, 5C show, in cross section and corresponding to a portion of FIG. 1, two emitters 30a and 30b associated respectively with columns 10a, 10b and the associated gun lens pole pieces 46a, 46b. FIG. 5B shows an enlarged view of part of emitter 30a. While depicted here as being of magnetic type, the gun lenses are alternatively electrostatic type or a combination of electrostatic and magnetic. Other illustrated structures include the electrical feed-throughs 160a, 160b for the filament current supply, suppressor electrode and extractor electrode electrical connectors 162a, 162b, the associated support structure 168, insulator blocks 170a and 170b, which are, e.g., of ceramic, and a flexible electrical coupling 174 for each electrical conductor. There is also, respectively, a suppressor cup 176a and 176b, and the actual emitter elements 178a and 178b. Associated with each emitter is a prealignment extractor electrode, respectively 180a and 180b. Vent hole 179 is for vacuum pump down.

To minimize aberrations introduced by misalignment, it is important to accurately align the emitter elements 178a, 178b to the center of extractor holes 180a, 180b, and to the centers of the respective gun lens pole pieces 46a and 46b. This is accomplished by precisely machining the parts, typically to a few tens of microns. The structure laterally surrounding pole pieces 46a, 46b is of non-magnetic material, e.g., aluminum. The position of the emitter elements 178a, 178b, relative to the respective gun lens pole pieces 46a, 46b is maintained during assembly by precisely guiding the emitter assembly member 183a into a corresponding socket 181a with an accuracy of a few tens of microns. The socket 181a is thereby positioned relative to the gun lens via precision machining to a precision in the order of a few tens of microns. A similar socket is provided for emitter 30b.

The associated electrical connectors 162a, 162b are coupled to flexible connectors 174 to take into account any misalignment between the feed-through structures 160a, 160b and the associated electrical connectors 162a, 162b. In addition, miniature dual electrical octapoles can be used to electrically steer the beam to the optical axis of each column.

Built-in emitter heaters 190a, 190b raise the vacuum temperatures to greater than 100.degree. C. during vacuum bring up. A thermocouple 195 measures the emitter temperature and thereby control the emitter heating. It is known that water vapor from the chamber walls prevents the vacuum from improving beyond $1 \times 10^{-7}$ and $1 \times 10^{-8}$ torr. Elevating the chamber temperature helps to drive off water condensation on the chamber walls so that water can be pumped out quickly. The heating elements are typically resistive electrical heater coils attached to the vacuum chamber body with a good thermal conduction contact. The emitter heating is turned off after the vacuum is pumped down to the operation pressure and, therefore, no magnetic field disturbance is introduced to the electron beams during column operation.

Immediate downstream of the electron gun (see FIG. 1) is the respective octapole (or a pair of octapoles) 45 which functions as a beam deflector and provide astigmatism correction, aperture 50, and isolation valve 60. The aperture 50 conventionally defines the diameter of the associated electron beam and is a passage through a plate otherwise opaque to the beam. In one embodiment, there are several apertures of different sizes associated with each beam column. When the beam current and/or resolution need to be adjusted to optimize to a particular inspection requirement, a different size aperture is selected by moving (orthogonally to the beam axis) the plate in which the apertures are defined.

Figure 6A:
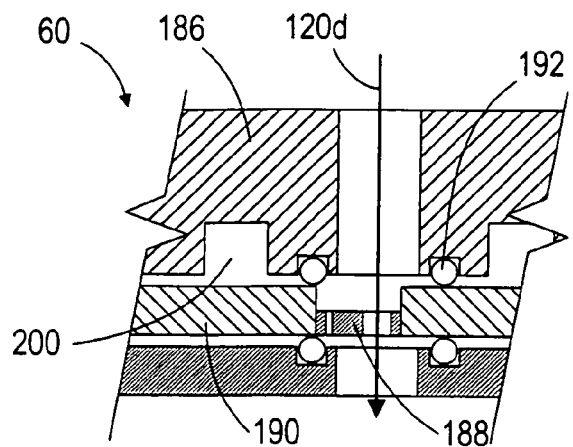
FIGS. 6A, 6B, 6C depict detail of the beam aperture and valve of FIG. 1.
Figure 6B:
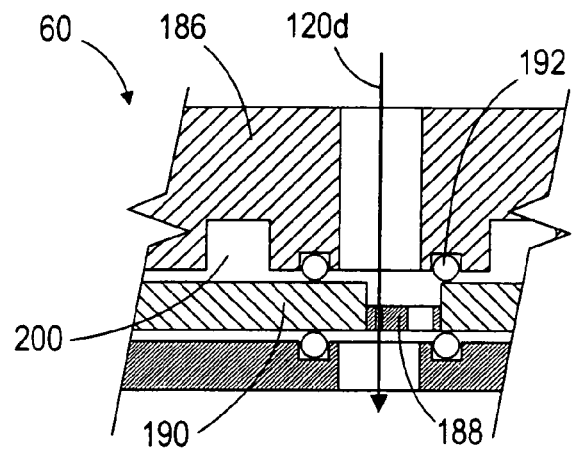
Figure 6C:
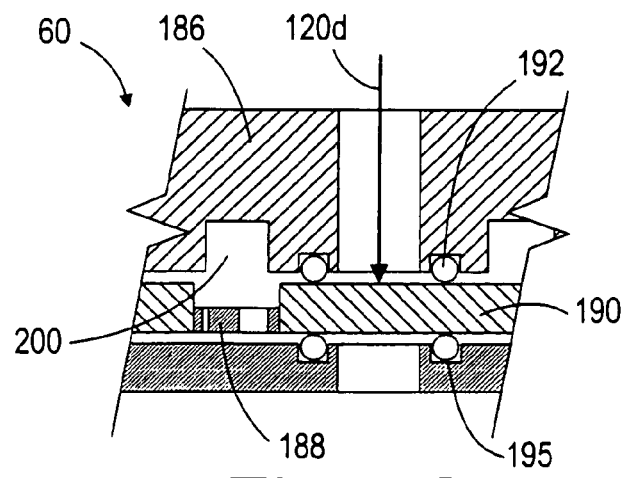

In one embodiment, an integrated aperture 50 and isolation valve 60 is used as depicted in FIGS. 6A, 6B, and 6C. All of the beam columns in the array share a common aperture plate 190 and hence the aperture sizes are changed in all columns simultaneously by translating plate 190 laterally. As an example, FIG. 6A shows two apertures 188 of different size. Fine movement of plate 190 selects either the large aperture (FIG. 6A) or the small aperture (FIG. 6B) as the aperture for the beam 120d. The number of different apertures can be greater than two; only two are shown. One issue related to the common aperture plate 190 is that it is not possible to finely adjust the aperture plate to simultaneously align each column beam to optimize the optics. The electrostatic gun octapole 45 (FIG. 1) can be independently adjusted for each column to serve this purpose. There is no need for a gun octapole in the null columns because the null columns do not have a beam.

Also associated with this portion of each beam column is the isolation valve 60, which isolates the vacuum in the upper part of each beam column, including the emitter 30, from the downstream portions of the beam column. Valve 60 is used, for instance, during emitter replacement or servicing (cleaning) of the downstream portions of the beam columns. In one embodiment, isolation valve 60 is as depicted in cross section FIGS. 6A, 6B, and 6C. By moving all the apertures outside the O-rings 192 and 195 (see FIG. 6B), no passage will exist between the emitter chamber and the rest of the column. The apertures are pumped via vent 200 by a pumping system which differs from the pumping system associated with the emitter chamber. The reason that the aperture vacuum needs to be pumped during closing of the isolation valve 60 is so that the vacuum in the emitter chamber will not degrade when the valve 60 is reopened again.

Referring again to FIG. 1, located next downstream in each beam column are the conventional optics 70 for objective lens alignment and astigmatism correction. These functions are accomplished by either an electrostatic or magnetic octapole(s). Next downstream in each beam column is detector 80 concentric to beam tube 220. Again, the null columns 20a and 20b contain no detector since they have no electron beam. In this embodiment, each column has its own independent detector 80 arranged to detect secondary and back-scattering electrons from the workpiece 118. Typically detector 80 is a conventional disc-shaped detector defining a central passage concentric to the associated electron beam and beam tube 220. Examples of suitable detectors are a microchannel plate, a micro-sphere plate, semiconductor detectors (PIN or avalanche diode), and scintillation type detectors.

Figure 7:
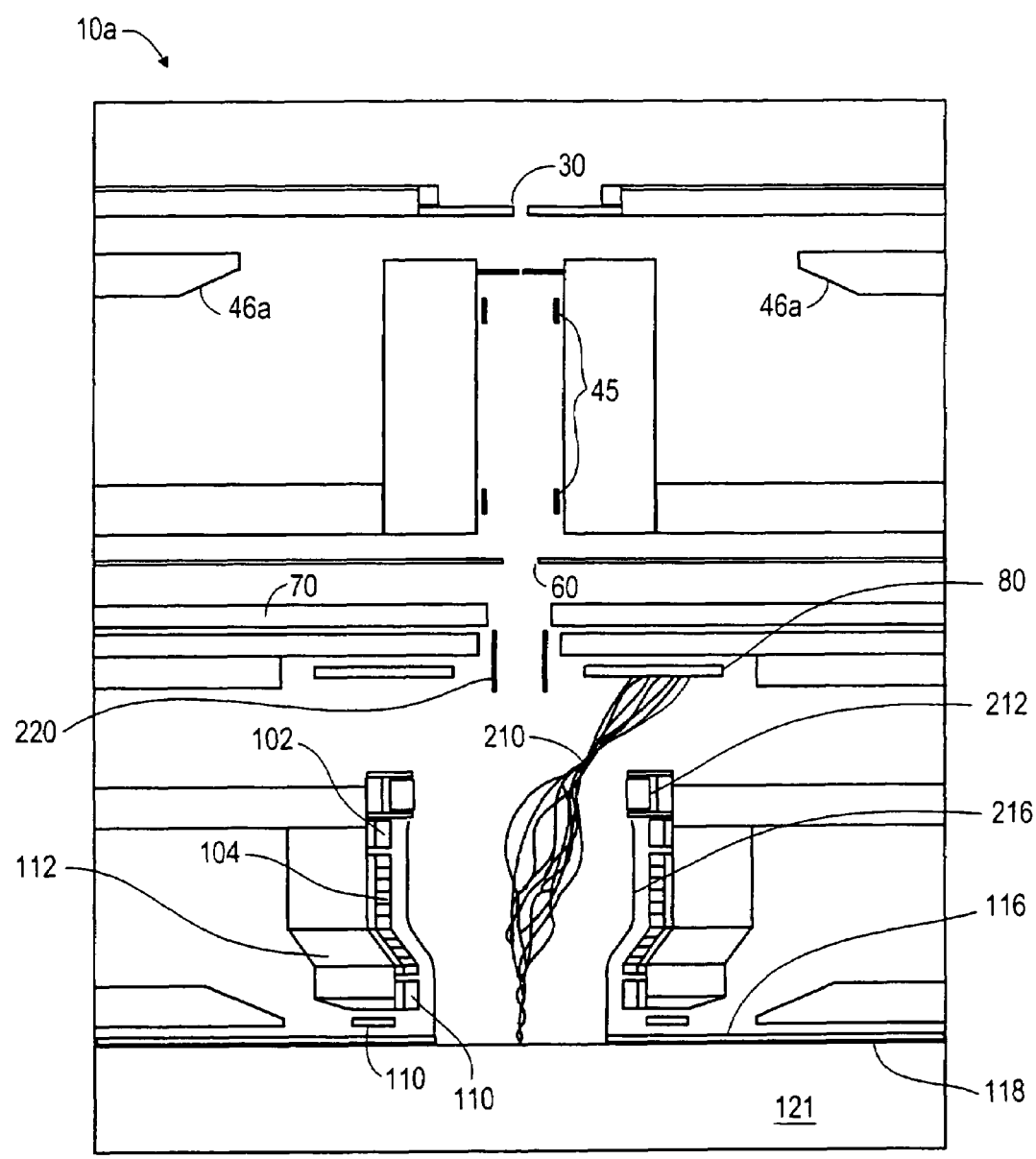
FIG. 7 depicts one of the columns of FIG. 1.

FIG. 7 depicts a single exemplary column 10a as in FIG. 1, but expanded for purposes of better depiction in the horizontal direction and showing the secondary electron paths 210. Similar structures are labeled as in FIG. 1. This embodiment also includes a conventional Wien filter 212. The Wien filter 212 is a well known device used in charged particle beam systems which generates electrostatic and electromagnetic fields to deflect the secondary electrons 210 into the detector 80 with no effect on the primary electron beam (not shown here). The Wien filter 212 consists of a pair of electrostatic plates and a perpendicularly arranged pair of magnetic coils. Also shown in this depiction is a liner tube 216, not illustrated in the earlier figures, for conducting the electron beam through the objective lens part of the column 10a. There is also the beam tube 220, which is electrically insulated from the detector 80 and passes through the detector 80 center hole. Tube 220 can be electrically biased to repel the secondary electrons 210. By balancing the electrostatic field and the magnetic field, secondary particles (electrons) 210, not the primary beam electrons, are deflected by the Wien filter 212 fields. Because the secondary particles 210 are deflected from the primary beam axis, the detector 80 does not have to be the concentric disc type if the Wien filter is present.

Except for the Wien filter 212 and the associated detectors, the remainder of the column structures shown in FIG. 7 are common to the embodiments employing either concentric detectors or those with a Wien filter 212. Solenoid coil 104 collimates secondary particles traveling from the workpiece 118 through the lens 100. When concentric detectors are used, the solenoid coil 104 can be energized to disperse the secondary electrons 210 so that the number of secondary electrons 210 traveling back up through tube 220 is minimized. Those secondary particles passing through the tube 220, will not be detected by the detector 80 and therefore, reduce detection efficiency.

The liner tube 216 has its lower end electrically connected to the charge control plate 116. The liner tube 216, similar to that used in the Schlumberger IDS 10000 series electron beam prober, is mounted inside the objective lens yoke as shown. The liner tube 216 is made of non-magnetic, insulator material such as ceramic. Its inner wall is coated with a conductive thin film that it has a typical resistance value in tens of kilo-ohms. A voltage relative to the charge control plate 116 is also applied to the upper end of the liner tube 216. A relative positive voltage on that upper end assists in collimating secondary particles. On the other hand, a relative negative voltage can be used as an energy filter selecting secondary particles 210, charging control to reflects secondary particles back to the wafer 118, and for preventing secondary particles 210 from reaching the detector 80 during pre-charging.

The objective lens also plays a role in secondary electron 210 detection. The magnetic field in each column objective lens (excited by the single coil 100) funnels the secondary particles 210 from the work piece 118 through the objective lens so as to avoid the need for a high extraction electric field on the surface of the work piece 118.

Figure 8:
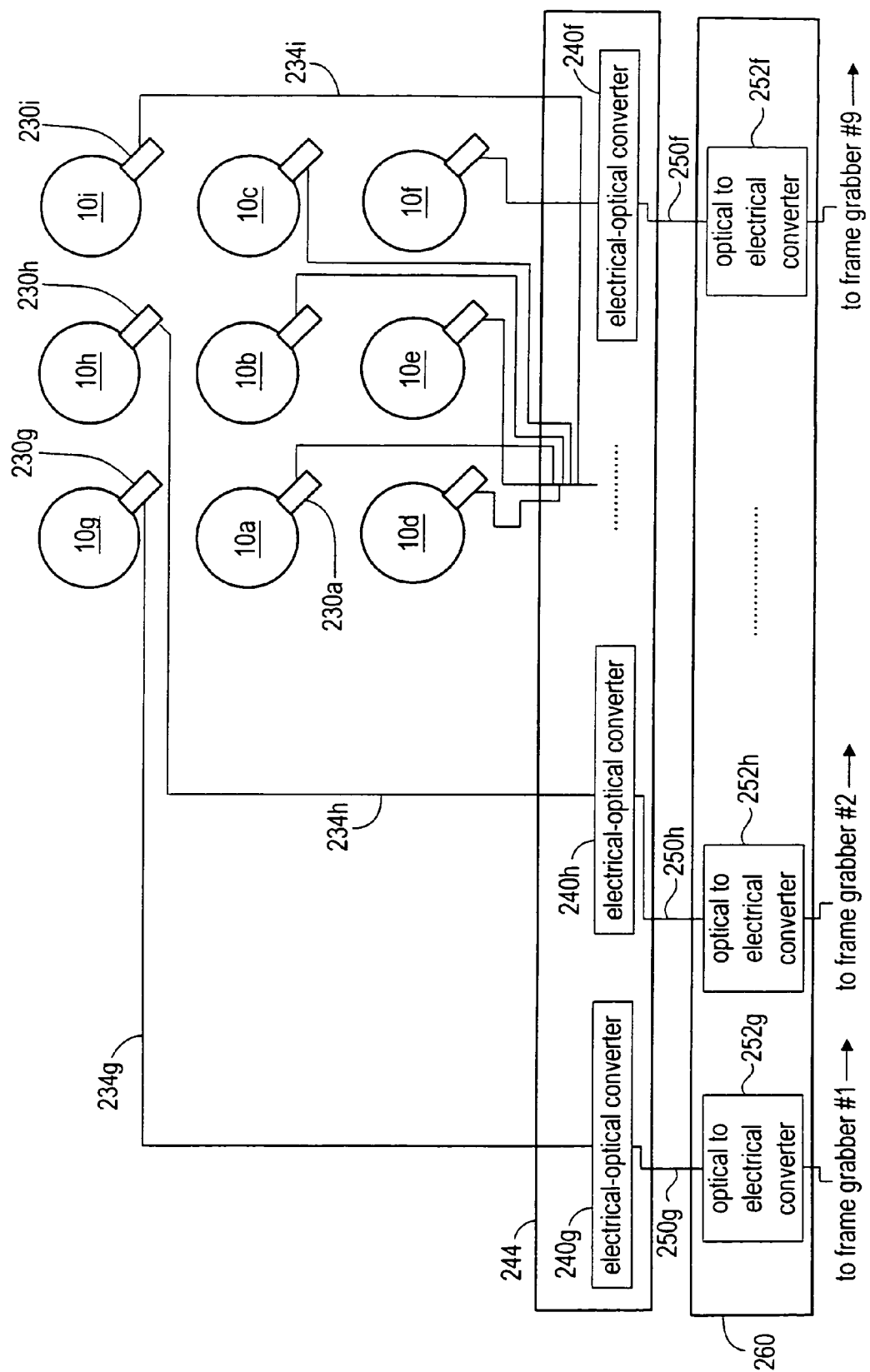
FIG. 8 depicts an electrical isolation arrangement for the detectors.

One detector 80 embodiment uses semiconductor PIN or avalanche diode type detectors because compactness makes them ideal for a two dimensional array configuration, and their fast rise and fall time (in the sub-10 nanosecond range) makes them ideal for high throughput inspection purpose. FIG. 8 depicts using such detectors for a 3.times.3 active column array, shown in a simplified plan view. Each column 10a, . . . , 10i in the array employs at least one detector 80 (not shown). Each detector is typically reversed biased at tens of volts. Each detector floats at a positive potential to attract the secondary particles and to achieve high electron multiplication at impact. Therefore electrical isolation is provided to bring the detector signal to ground in order to couple the signals to an associated conventional frame grabber for data analysis and image construction. Each detector is connected to a local pre-amplifier, e.g., 230g, 230h, 230i.

The amplified signals from e.g., preamplifier 230g are transmitted through individual high voltage cables such as 234g (a transmission line) to a electrical to an optical signal converter 240g (residing in enclosure 244) that floats at an elevated voltage, typically in the range of 5 to 20 KV. The detector and the local pre-amplifier 230g also float at the same high voltage because of the connection to the converter 240g where the detector signal is converted into an analog optical signal. The optical signals are then transmitted via optical fiber 250g to a optical to electrical converter 252g (located inside enclosure 260) where the signal is again converted back to electrical signals relative to ground. Each detector signal is conventionally then coupled to the associated frame grabber (not shown) for image construction.

Referring back to FIG. 1, the cylindrically symmetric (conical) pole piece structures 46, 112 are conventionally made of magnetic material, for instance, carbon free iron, and nickel-iron alloy. The magnetic field strength is on order of several hundred to several thousand Gauss. The magnetic coils 40, 100 are made of Kapton or polyimide coated copper wire. Typically the coils 40, 100 are each wound in several hundred turns and excited by a current of several amperes.

In one embodiment, each column 10a, 10b, 10c is provided with two sets of conventional pre-scan coils 102 and scan coils 110, similar to that currently used in the Schlumberger Odyssey 300 electron beam wafer inspection tool referred to above. The scan or pre-scan coil sets consist of coils operating in the x and y direction. The two coil sets 102, 110 are positioned surrounding ends of the liner tube 216 as shown in FIG. 7. To optimize beam size and field of view size, coil positions, the field strength ratio generated between the two coil sets 102, 110 (that is, the relative field strength), and the angle between the two field vectors generated by the two coil sets 102, 110 (relative angle) needs to be determined for each column. This can be done using a simulation software package supplied by MEBS, Ltd, England. In one embodiment a movable axis or a shifting axis scheme for the beam is accomplished by using the two coil sets.

The theory for such a movable lens and a shift axis lens is found in numerous publication. See, e.g., Optik vol. 48 (1977) pages 255-270 "MOL (Moving Objective Lens)" by E. Goto et al, incorporated herein by reference. A brief description of the principle is as follows: When a beam travels through the lens optical center, the beam trajectory is not affected by the presence of the lens field. On the other hand, when the beam travels off the optical center, it experiences a transverse field pulling toward the axis. The concept of a movable or shift axis lens is to use the first set of scan coils to deflect the beam off the lens center. A second set of scan coils in the close vicinity of the lens focusing field is used to generate an opposite filed to cancel or minimize the lens transverse field. This requires the field vector generated by the second set of scan coils to be adjusted electronically.

In one embodiment, by shifting the lens axis per field of view, each column can electronically step (translate) and acquire multiple frames of images during inspection before the need for stage movement. In another embodiment, the lens axis is adjusted pixel-by-pixel while acquiring a wide field of view, high resolution images. This approach is used for a continuous moving stage scheme, as discussed below.

It is expected that each column will require a slightly different objective lens excitation to focus the portion of the workpiece in the field of view. This is due to small mechanical variations, cathode variation, and workpiece height variations between columns. Because there is only one objective lens focusing coil 100, each column is additionally provided with its own associated subsidiary focusing coil 110 (FIG. 1) that has a much weaker focus strength than does coil 100, to compensate for the focus variation column-to-column. Each coil 110 is individually energized for individual column focussing. Electrostatic subsidiary focusing is an alternative, for instance using octapoles.

Figure 9:
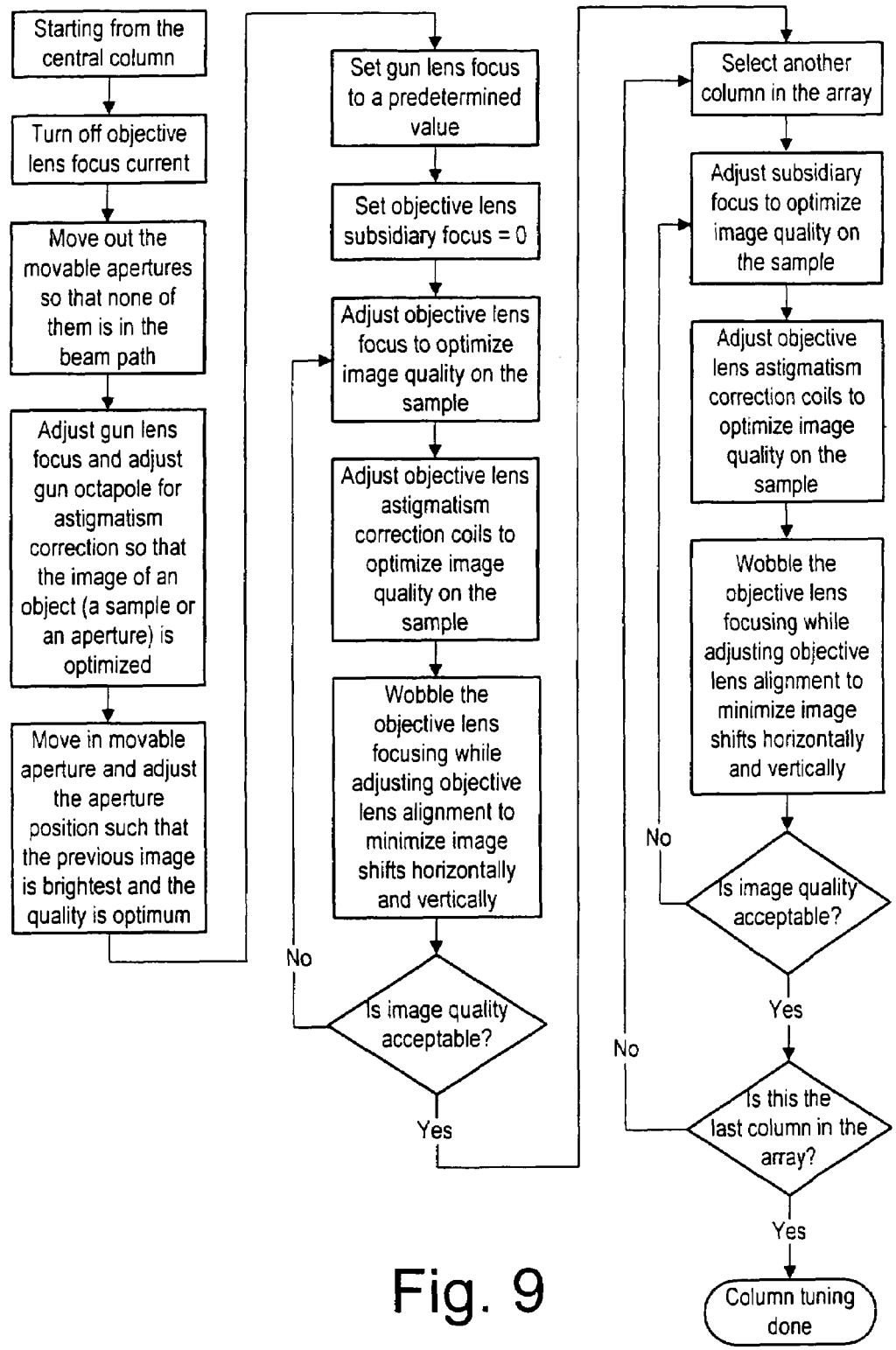
FIG. 9 depicts a focussing and adjusting process for the FIG. 1 apparatus.

FIG. 9 shows an adjustment and focusing method useful with the FIG. 1 apparatus. This is essentially a conventional process, typically carried out manually or under control of a computer program. Each act is as shown in FIG. 9. This process is carried out periodically, for instance, once a day or perhaps once a week.

The above-described tool can be used in various inspection or lithography (electron beam patterning of resist)

applications. Movement of the workpiece relative to the electron beam column array is accomplished, e.g., by step-and-scan or by continuous movement. Typically this is accomplished by movement of the stage 121 (FIG. 1) supporting the wafer 118 as is conventional. In one embodiment the stage 121 is an x-y stage, e.g., similar to that used in Schlumberger Odyssey 300 inspection tool or as referred to above in the copending patent application. The stage 121 is capable of translating a 300 mm wafer in both the x and y directions. An upper stage (not shown) is driven by a set of piezo-electric motors, which in turn are carried by a linear motor traveling in a perpendicular direction. This arrangement eliminates stage interference (electromagnetic radiation, magnetic structure distorting objective lens field, etc) to the column optics while maintaining a reasonable footprint.

Figure 10:
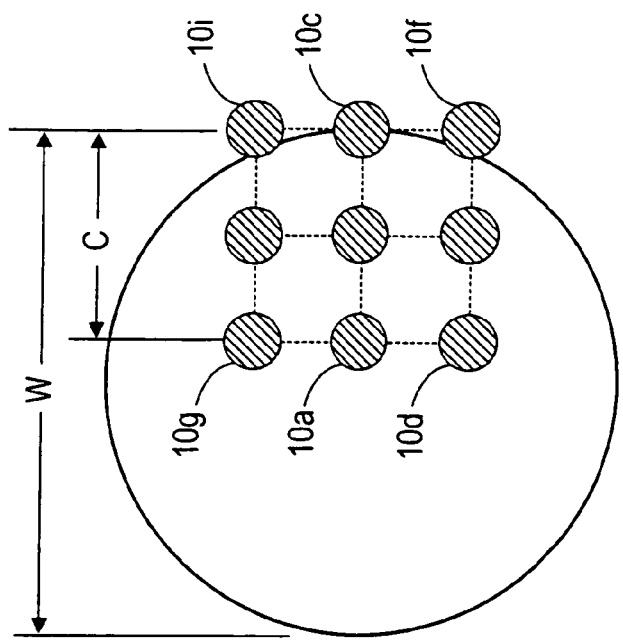
FIG. 10A, 10B illustrate stage travel for the FIG. 1 apparatus.
Figure 10A:
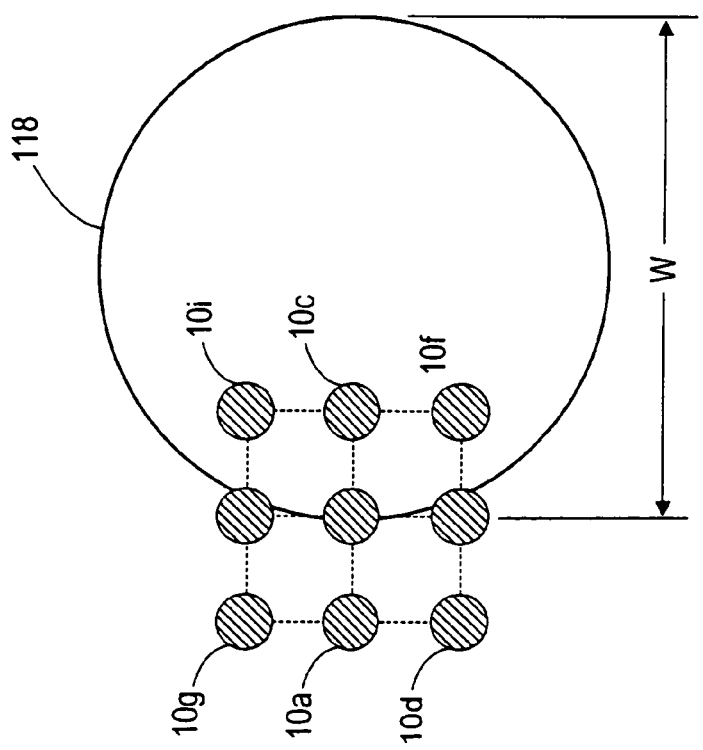

In one embodiment, the column locations are spread out so that the required stage travel is significantly reduced. In FIG. 10A a 3.times.3 active column array (as in FIG. 8) is depicted in simplified plan view to show this stage travel reduction. The center-to-center distance between the left columns 10g, 10a, 10d and right columns 10i, 10c, 10f is C. Because the left side of the wafer 118 (which has a diameter of W) can be inspected by the left column array 10g, 10a, 10d whereas the right end of the wafer 118 can be inspected by the right column array 10i, 10c, 10f (see FIG. 10B)), the stage 121 (not shown but carrying wafer 118) only needs to travel in the horizontal direction by a distance (W-C) to allow inspection of the entire wafer 118. Similarly, the stage 121 needs to travel only distance (W-C) in the vertical direction. This results in substantial reduction in the system footprint considering the corresponding reduction in other system elements such as the vacuum chamber, the frame structure supporting the stage and the beam columns, and the mechanical vibration isolation. For instance, by arranging the left side and right side beam columns 100 mm apart center-to-center (distance C), a 200 mm stage can be used to inspect a 300 mm wafer (300 mm–100 mm=200 mm). Currently, a typical system employing a 200 mm travel stage is about 25 to 50% smaller in footprint than a system equipped with a 300 mm travel stage. Hence this reduction in travel considerably reduces system size.

In the event of failure of one of the electron beam columns, for instance, due to its emitter being burned out, the entire tool need not go out of service; instead, inspection may continue with the conventional control unit (e.g., a computer, not shown) translating the wafer 118 on its stage 121 relative to the electron beam column array, to bring one of the still active electron beam columns into alignment with the wafer area that was to have been inspected by the failed electron beam column. Also, this tool may be used for large area coverage at coarser resolution to narrow down areas of likelihood for defects. Those particular identified potential defect areas may then be re-inspected with a conventional higher resolution single electron beam inspection tool to reduce the nuisance rate of false detection of defects.

While the above tool is described in the context of electron beam column techniques, it is possible to substitute ion beams, with some added complexity due to the need to generate ion beams of requisite brightness.

Therefore, this disclosure is illustrative and not limiting; further modifications will be apparent to those skilled in the art in light of this disclosure and are intended to fall within the scope of the appended claims.

The invention claimed is:

1. A method of inspecting a workpiece, comprising generating an array of charged particle beams; passing each of the charged particle beams through one of a plurality of pole pieces, there being one pole piece associated with each charged particle beam, and through a single lens coil surrounding the plurality of pole pieces; directing the array of charged particle beams onto a area of the workpiece so as to produce secondary or backscattered particles; detecting the secondary or backscattered particles; reconstructing an image of the area of the workpiece from detected ones of the secondary or backscattered particles; determining if one of the charged particle beams has failed; and translating the workpiece relative to the array of charged particle beams, thereby to direct a remaining one of the charged particle beams onto that portion of the workpiece onto which the failed beam was intended to be incident.

2. The method of claim 1, wherein each of the charged particle beams is directed onto a different region of the workpiece.

3. The method of claim 1, wherein the workpiece is translated relative to an axis of the array of charged particle beams.

4. The method of claim 1, farther comprising focusing individually each of the charged particle beams onto the workpiece; and providing a plurality of additional focusing fields, one associated with each of the beams.

5. The method of claim 4, wherein the additional focusing fields are located at a perimeter of the array of charged particle beams.

* * * * *